US010862207B2

United States Patent
Vehovc et al.

(10) Patent No.: US 10,862,207 B2
(45) Date of Patent: Dec. 8, 2020

(54) DEVICE SYSTEM AND METHOD FOR RADIO FREQUENCY SIGNAL PATH CALIBRATION

(71) Applicant: Infineon Technologies AG, Neubiberg (DE)

(72) Inventors: Samo Vehovc, Unterhaching (DE); Ivan Tsvelykh, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 311 days.

(21) Appl. No.: 15/830,882

(22) Filed: Dec. 4, 2017

(65) Prior Publication Data

US 2018/0159219 A1    Jun. 7, 2018

(30) Foreign Application Priority Data

Dec. 5, 2016    (DE) .................. 10 2016 123 459

(51) Int. Cl.

| | |
|---|---|
| *H01Q 3/26* | (2006.01) |
| *H04B 17/14* | (2015.01) |
| *H04B 17/11* | (2015.01) |
| *H04B 17/21* | (2015.01) |
| *H03K 5/00* | (2006.01) |
| *H01Q 3/36* | (2006.01) |
| *H01Q 3/28* | (2006.01) |

(52) U.S. Cl.
CPC ............ *H01Q 3/267* (2013.01); *H04B 17/11* (2015.01); *H04B 17/14* (2015.01); *H04B 17/21* (2015.01); *H01Q 3/2694* (2013.01); *H01Q 3/28* (2013.01); *H01Q 3/36* (2013.01); *H03K 5/00* (2013.01); *H03K 2005/00019* (2013.01)

(58) Field of Classification Search
CPC ... H04B 7/11; H04B 7/21; H04B 7/12; H04B 7/13; H04B 7/14; H03L 7/08; H03L 7/081; G06F 1/10; H01Q 3/267
See application file for complete search history.

(56) References Cited

U.S. PATENT DOCUMENTS

| | | | |
|---|---|---|---|
| 5,086,500 A * | 2/1992 | Greub ................. | G06F 15/7835 713/401 |
| 5,391,996 A * | 2/1995 | Marz ...................... | H03L 7/081 327/158 |

(Continued)

FOREIGN PATENT DOCUMENTS

| | | |
|---|---|---|
| CN | 1830159 A | 9/2006 |
| CN | 105763269 A | 7/2016 |

(Continued)

OTHER PUBLICATIONS

Inac, Ozgur et al., "A Phased Array RFIC with Built-In Self-Test Capabilities," IEEE Transactions on Microwave Theory and Techniques, vol. 60, No. 1, Jan. 2012, 10 pages.

(Continued)

*Primary Examiner* — Gregory C. Issing
(74) *Attorney, Agent, or Firm* — Slater Matsil, LLP

(57) ABSTRACT

Devices, methods and systems are disclosed relating to RF signals. A device may comprise a clock input terminal, a variable delay circuit coupled to the clock input terminal and a test terminal as well as a reference signal generator coupled to the variable delay circuit.

16 Claims, 8 Drawing Sheets

(56) References Cited

U.S. PATENT DOCUMENTS

| | | | |
|---|---|---|---|
| 6,236,697 B1* | 5/2001 | Fang | H03L 7/07 331/25 |
| 6,356,122 B2* | 3/2002 | Sevalia | H03L 7/081 327/105 |
| 6,838,917 B2* | 1/2005 | Brass | G11C 7/1066 327/158 |
| 7,920,652 B2* | 4/2011 | Hayase | H03D 3/245 375/130 |
| 7,983,375 B2* | 7/2011 | Dulger | H03L 7/1806 375/376 |
| 8,217,699 B2* | 7/2012 | Chee | H03K 5/15066 327/295 |
| 8,754,811 B1* | 6/2014 | Uscinowicz | H01Q 3/267 342/375 |
| 2002/0105365 A1 | 8/2002 | Kudo et al. | |
| 2003/0012305 A1* | 1/2003 | Auranen | H04L 27/3863 375/316 |
| 2003/0067334 A1 | 4/2003 | Brass et al. | |
| 2004/0125905 A1* | 7/2004 | Vlasenko | H03L 7/0814 375/376 |
| 2008/0192876 A1 | 8/2008 | Dulger et al. | |
| 2010/0315145 A1 | 12/2010 | Chee et al. | |
| 2012/0087230 A1 | 4/2012 | Guo et al. | |
| 2014/0097986 A1* | 4/2014 | Xue | H03L 7/23 342/372 |
| 2016/0146931 A1 | 5/2016 | Rao et al. | |
| 2016/0254870 A1* | 9/2016 | O'Keeffe | H01Q 21/24 455/67.14 |
| 2017/0201019 A1 | 7/2017 | Trotta | |

FOREIGN PATENT DOCUMENTS

| | | |
|---|---|---|
| JP | 2012237556 A | 12/2012 |
| KR | 20000031481 A | 6/2000 |
| KR | 20020044084 A | 6/2002 |
| KR | 100832409 B1 | 5/2008 |
| KR | 20080096202 A | 10/2008 |
| KR | 101235087 B1 | 2/2013 |
| KR | 20150100032 A | 9/2015 |
| WO | 2007060069 A1 | 5/2007 |

OTHER PUBLICATIONS

Kuehnke, Lutz, "Phased Array Calibration Procedures Based on Measured Element Patterns," 2001 Eleventh International Conference on Antennas and Propagation, IEEE Conf. Publ. No. 480, vol. 2, pp. 660-663.

* cited by examiner

DEVICE SYSTEM AND METHOD FOR RADIO FREQUENCY SIGNAL PATH CALIBRATION

This application claims the benefit of German Patent Application No. 102016123459.1, filed on Dec. 5, 2016, which application is hereby incorporated herein by reference in its entirety.

TECHNICAL FIELD

The present application generally relates to devices, systems and methods involving calibration of radio frequency (RF) signal paths.

BACKGROUND

Phased array transmit/receive system are desired for many applications such as broadcasting, radar, space probe communication, weather research, optics, RF identification systems and tactile feedback systems. Such systems may also be used for gesture sensing, communication backhauling and highspeed routing in wireless gigabit (WiGig) or other consumer wireless systems.

A phased array is an array of antennas in which relative phases and amplitudes of a plurality of signals transmitted over the antennas may be adjusted. This adjustment may be performed in various parts of the systems and devices, e.g. RF, intermediate frequency (IF) or baseband (BB) parts, before or after analog-to-digital or digital-to-analog conversion etc. By proper adjustment, the effective radiation pattern of the array may be formed in a desired manner, which is also referred to as beam shaping. This beam shaping of the radiation pattern occurs due to constructive and destructive interference between the signals transmitted by each antenna of the array of antennas. Through adjustable phase and amplitude relationships, so-called beam steering may be performed, i.e. the radiation pattern may be modified. Reception may be done in a similar manner, thus providing a reception sensitive to a particular radiation pattern, for example to radiation from a particular direction.

One type of phased arrays is a dynamic phased array. In a dynamic phased array, each signal path providing a signal to an antenna incorporates an adjustable phase shifter, and these adjustable phase shifters may for example collectively be used to move the beam. Moreover, the signal path may comprise adjustable amplifiers, which provide further adjustment possibilities.

Such adjustable phase shifters and/or amplifiers may exhibit variations in their behavior for example due to process variations or temperature variations. This influences the accuracy of a radiation pattern generated or received, and/or may influence the accuracy of beam steering. Therefore, phase calibration of the signal paths is desirable.

Calibration approaches for various signal paths on a single chip are discussed in Ignac et al, IEEE TRANSACTIONS ON MICROWAVE THEORY AND TECHNIQUES, Vol. 60, No. 1, January 2012. In some phased arrays, a number of antennas exceeds the number of signal paths provided on a single chip (for example, some hundred up to some tens of thousands of antennas).

SUMMARY

According to an embodiment, a radio frequency, RF, device is provided, comprising: a clock input terminal, a variable delay circuit, wherein an input of the variable delay circuit is coupled to the clock input terminal, a test terminal, wherein the test terminal is coupled to an output of the delay circuit, a reference signal generator coupled to the output of the delay circuit and configured to generate a reference signal based on a clock signal received at the clock input terminal delayed by the variable delay circuit, and an RF circuit configured to receive the reference signal.

According to a further embodiment, a system is provided, comprising: a plurality of devices as described above, and a clock generator, wherein the clock generator is coupled with clock input terminals of at least a subset of the plurality of devices, wherein the variable delay circuits of the subset of the plurality of devices are set to compensate delay variations due to different coupling lengths between the clock generator and the subset of devices.

According to another embodiment, a method is provided, comprising: switching off transmit paths and/or receive paths except a transmit path and/or receive path to be calibrated, performing calibration measurements based on a reference signal which is provided via a variable delay, and repeating the calibration for a plurality of transmit and/or receive paths to be calibrated.

According to another embodiment, a method is provided, comprising: operating a phased antenna array in a time division duplexing scheme, and calibrating at least one of transmit paths or receive paths in time gaps between transmit signals and receive signals of the time division duplexing scheme.

The above summary is merely intended to give a brief overview over some aspects of some embodiments and is not to be construed as limiting.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
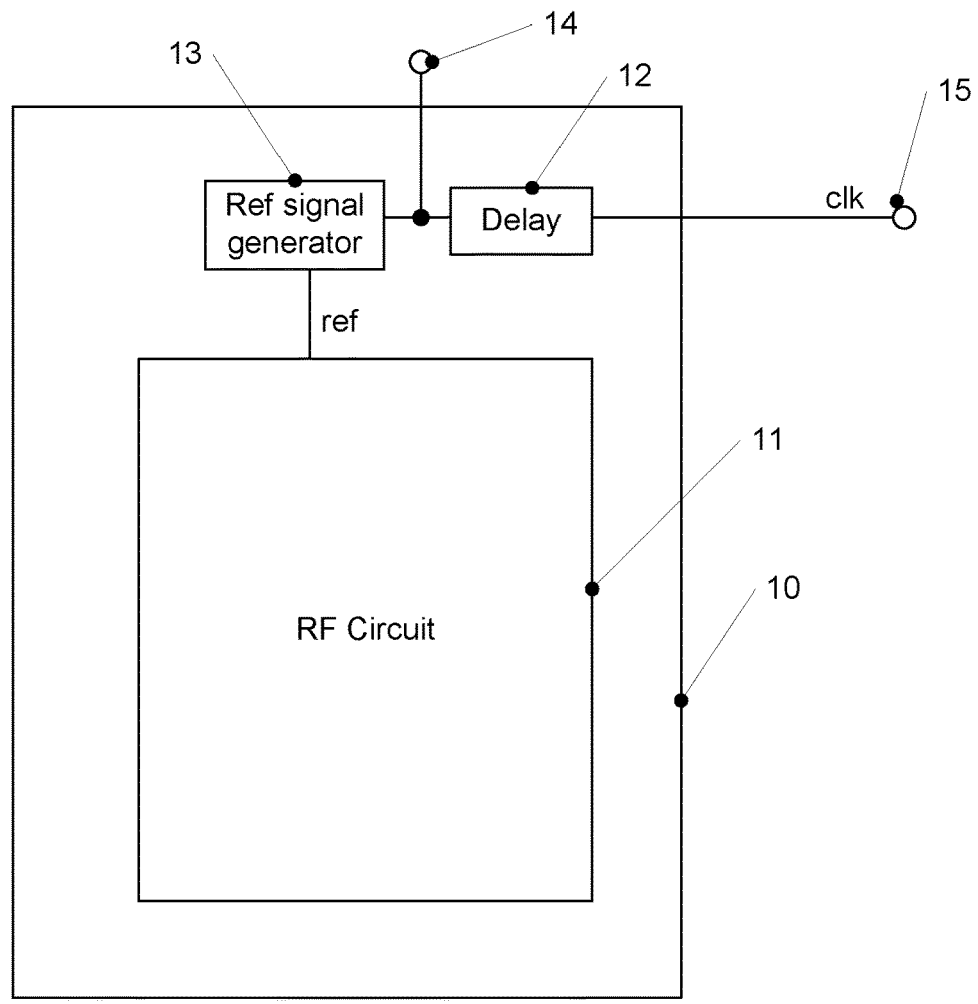
FIG. 1 is a block diagram of a device according to an embodiment.

In the following, various embodiments will be described in detail referring to the attached drawings. It should be noted that these embodiments are given by way of example only and are not to be construed as limiting. For example, while embodiments may be described comprising numerous features or elements, in other embodiments some of these features or elements may be omitted, and/or may be replaced by alternative features or elements. Also, apart from features or elements explicitly shown in the drawings or described herein, further features or elements, for example features or elements conventionally used in phased arrays, may be provided.

In some embodiments, RF devices, e.g. phased array devices, are provided with a clock input coupled to a variable delay. By adjusting the variable delays of different RF devices, different clock signals delivered to different RF devices may be compensated for, which in some embodiments enables a calibration across a plurality of devices. Each of such devices may be provided on an individual chip or chip die. In some embodiments, calibration possibilities are provided for signal paths provided on different chips.

The term "variable delay" as used herein may for example refer to a phase shift applied to a signal, which may be seen as a delay of a fraction of a complete period (3600) of a signal.

Turning now to the figures, FIG. 1 illustrates a schematic block diagram of a radio frequency (RF) device according to an embodiment. RF device to may be implemented on a single chip and/or may be provided in a single chip package. In other embodiments, a plurality of devices to may be provided in a single chip package. In some embodiments, RF device to may be coupled to an antenna array to implement a phased array system. In some embodiments, a plurality of devices to may be used in a phased array system, each device to being coupled to a subset of antennas of the antenna array. RF device to comprises an RF circuit 11 to provide a desired RF functionality. In some embodiments, as will be described further below in more detail, RF device 11 may comprise phase shifters and/or amplifiers, for example adjustable amplifiers, to provide phased array functionality.

RF device to furthermore comprises a clock input terminal 15 for receiving a clock signal clk. Terminal 15 is coupled with an input of a variable delay element 12. Variable delay element 12 may be implemented in any conventional manner, for example by using variable inverter chains, individual inverters serving as delay elements, or as a phase shifter. An output of variable delay element 12 is coupled to a test terminal 14 accessible from outside device to and to a reference signal generator 13. Reference signal generator 13 based on a delayed clock signal output by variable delay circuit 12 generates a reference signal ref having a desired frequency. To generate ref, reference signal generator 13 may for example comprise a phase locked loop (PLL) circuit, for which the delayed clock signal clk serves as a reference clock signal. In this way, a reference signal ref having a desired clock frequency may be generated aligned in phase with the delayed clock signal clk.

Reference signal ref, as will be explained later in more detail, may then be used to calibrate RF circuit 11. When a plurality of devices to is incorporated in a single system, for example a phased array, by using variable delay circuit 12, clock signals used for reference signal generation in different devices to may be aligned. To this end, a measurement device like an oscilloscope may be coupled to test terminals 14 of the plurality of devices, and the variable delays 12 of the plurality of devices to may be adjusted until the clock signals are aligned. In this way, also the reference signals are aligned, and by using these aligned reference signals ref for testing in all devices to, calibration across all devices then may be performed.

Such an adjustment of variable delays 12 of a plurality of devices to provided in a single system may be performed in the factory where the system is manufactured. In this way, in particular variable lengths of lines from a common source for clock signal clk to the terminals 15 of different devices to of the system may be compensated.

Figure 2:
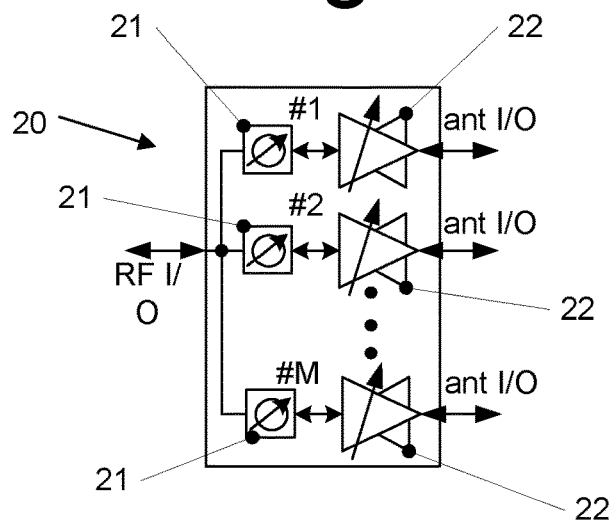
FIG. 2 illustrates RF circuitry usable in some embodiments.

FIG. 2 illustrates an example RF circuit 20, which may for example be used as circuit 11 of FIG. 1 or part thereof. The circuit of FIG. 1 comprises M signal paths, labelled #1 to #M in FIG. 2. Each signal path comprises an adjustable phase shifter 21 and an adjustable amplifier arrangement 22. Phase shifters 21 may be implemented using any conventional phase shifting techniques, for example weighted mixing of signals. For signal transmission, each signal path receives a radio frequency input signal RFI, phase shifts and amplifies the signal and outputs a corresponding signal out O to a respective antenna. In each signal path, the phase shift and amplification may be different, which may be used to provide a beam forming and/or beam steering functionality. For reception of signals, signals ant I are received from a plurality of antennas, amplified by amplifiers 22 and phase shifted by phase shifters 21, then combined and output as signals RF O. In such a way, by adjusting amplitudes of amplifiers 22 and phase shifts by phase shifters 21 accordingly, for example angular selective reception or scanning reception of signals may be achieved.

As explained initially, to provide exact beam steering, or corresponding reception functionality, differences between phase shifters 21 have to be adjusted correctly. Due to process or temperature variations or other tolerances, variations from nominal phase shift values (i.e. intended values) or from nominal amplifications occur, which may be resolved through calibration using the reference signal ref or FIG. 1. As aligned reference signals ref may be provided to a plurality of devices to, calibration between different devices may be implemented. In particular, a plurality of such devices as illustrated in FIGS. 1 and 2 may be used for larger antenna arrays. For example, as shown in FIG. 2, a single device to may serve M channels, and by using P such devices N=M×P channels may be provided. This is schematically shown in FIG. 3.

Figure 3:
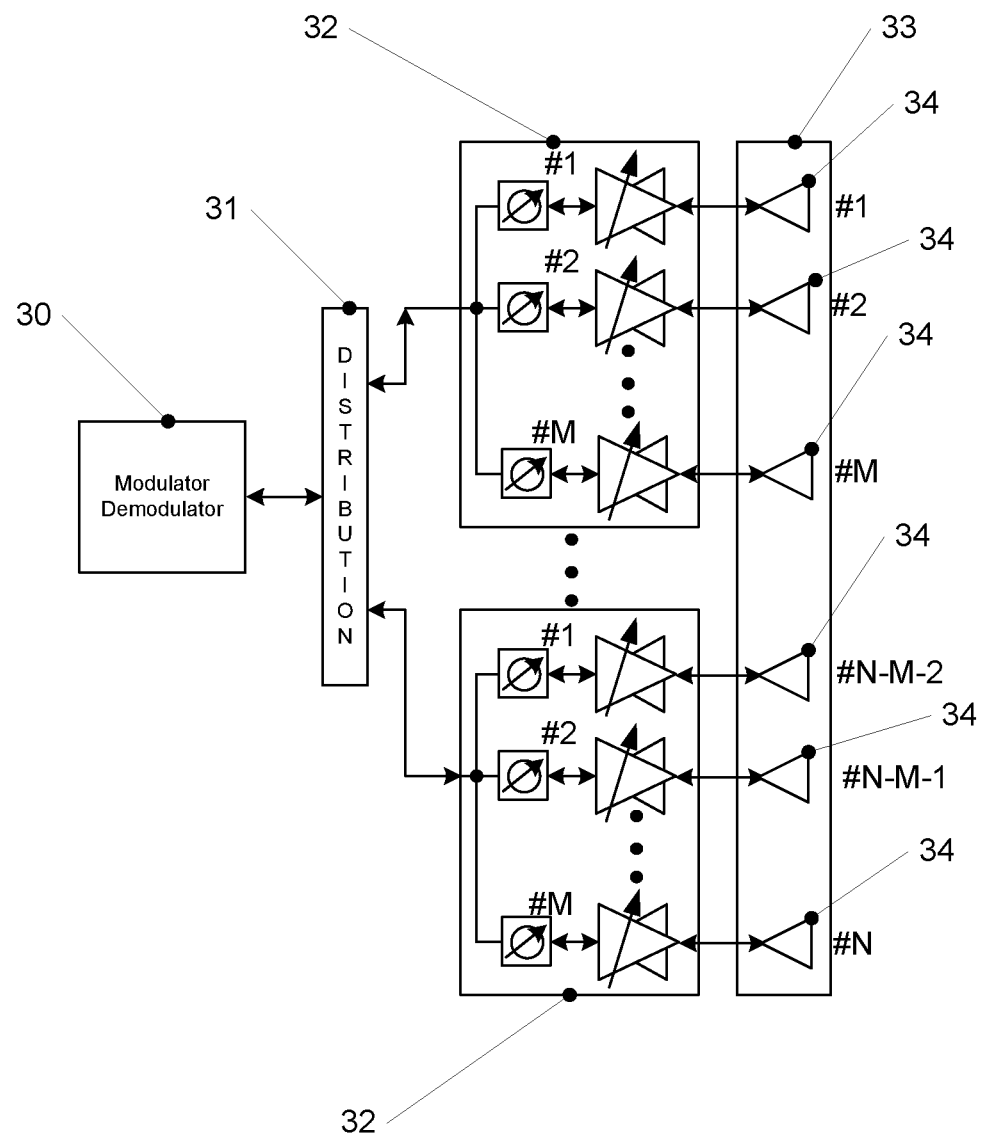
FIG. 3 illustrates some elements of a system according to an embodiment.

FIG. 3 illustrates a system according to an embodiment. The system of FIG. 3 comprises a plurality of devices 31, 32, which may be implemented as discussed with reference to FIGS. 1 and 2 and each may serve M antennas. By providing P such devices 32, N=M×P antennas 34 of antenna array 33 may be served.

For transmission, a modulator/demodulator generates a modulated RF signal. In particular, the RF signal may be modulated for example according to data to be transmitted or according to any other desired modulation pattern. A distribution circuit 31 then distributes this signal to the various devices 32, which in turn drive antennas 34 with phase-shifted and amplified versions of this signal. For reception, signals are received via antennas 34, phase shifted and amplified in devices 32 and combined in distribution circuit 31. The combined signals may then be demodulated in modulator/demodulator 30. It should be noted that while in the embodiments discussed so far transmission and reception functionality is provided, in other embodiments only transmission functionality or only reception functionality may be provided.

Each of devices 32 may be implemented on a single chip or single chip die, and may be provided in separate packages or in a single common package. With the techniques discussed above referring to FIGS. 1 and 2 for providing aligned clock signals, a calibration between different devices 32 is possible in some embodiments.

Next, referring to FIG. 4, a more detailed block diagram of a device 40 according to an embodiment will be discussed. Device 40 may be seen as a non-limiting more detailed example of device 32 of FIG. 3, but implementation of device 32 is not limited to the one shown in FIG. 4. Device 40 may be integrated on a single chip or chip die and/or may be provided in a single package. A plurality of devices 40 may be combined in a system, for example as illustrated for devices 32 in FIG. 3.

Device 40 comprises a plurality of transmit and receive paths which may be coupled to respective antennas. In the device of FIG. 4 four transmit paths and four receive paths are shown. However, this is not to be construed as limiting, and generally M receive paths and/or M receive paths may be provided. It should be noted that the number of transmit paths may also be different from the number of receive paths in some embodiments. In some embodiments, the number of transmit paths and receive paths may be limited by the possibilities of integration on a single chip.

Each transmit path comprises a phase shifter 47 and a power amplifier 48 to provide an adjustable phase shift and an adjustable amplification. Each receive path comprises an adjustable amplifier 49, for example a low noise amplifier (LNA), and a phase shifter 47.

For transmission, an intermediate frequency signal IF is provided to an upconverter/downconverter 416, which for transmitting converts the intermediate frequency signal IF to a radio frequency (RF) signal, which may be amplified by an amplifier 415. The thus generated RF signal is provided to a power combiner 410, which distributes the RF signal to the transmit paths.

For reception, signals are received via the receive paths, combined in power combiner 410 and downconverted to an intermediate frequency signal IF by downconverter 416.

Furthermore, device 40 comprises various circuit sections which may be used for testing purposes, as will be explained now in more detail.

Figure 4:
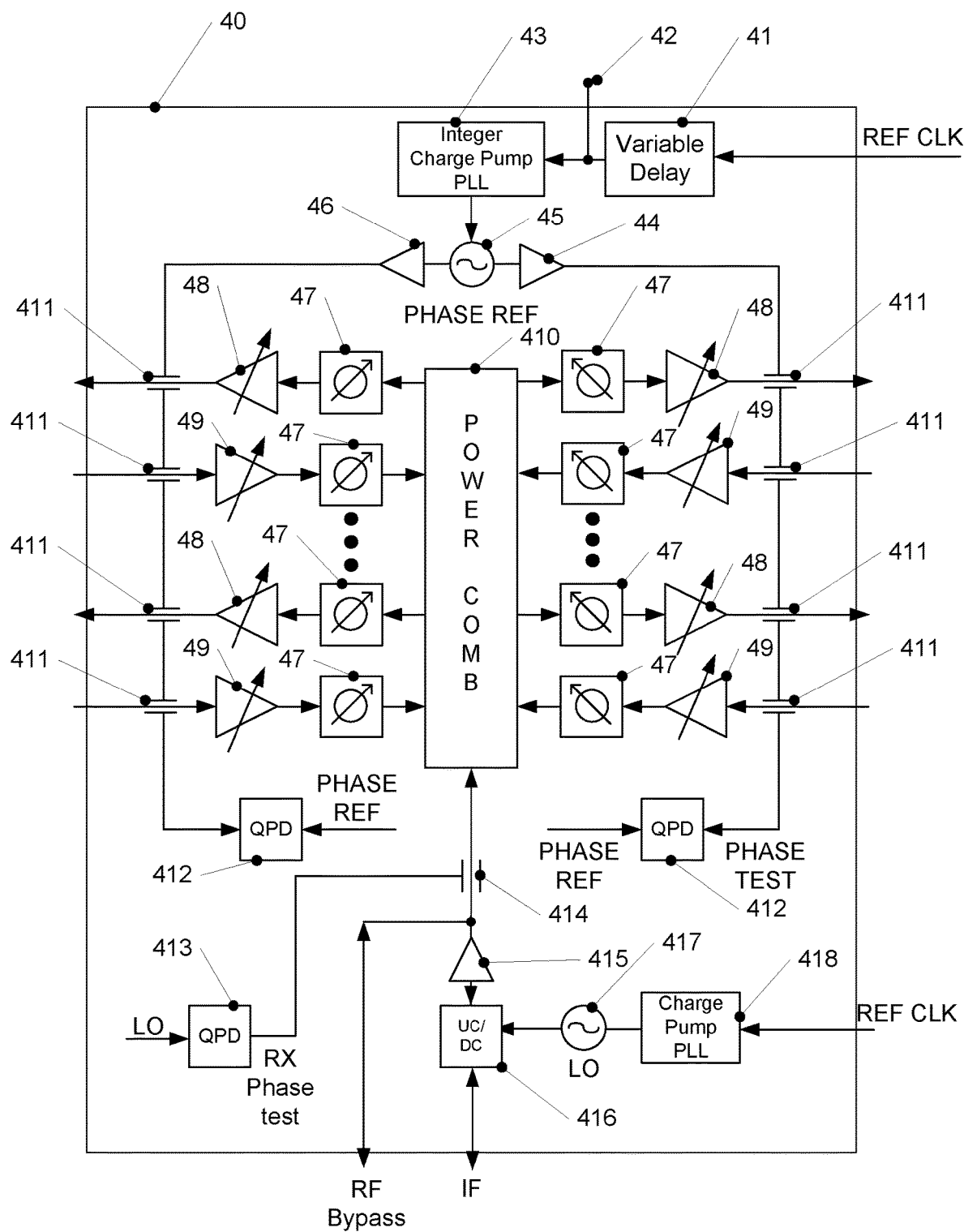
FIG. 4 is a detailed block diagram of a device according to an embodiment.

Device 40 of FIG. 4 comprises a variable delay circuit 41 and a test terminal 42. As already explained with respect to FIG. 1, variable delay circuit 41 receives a reference clock signal REF CLK. By tapping a delayed version of this signal at an output of variable delay circuit 41 at test terminal 42, in a system comprising a plurality of devices 40 variable delay circuits 41 in different devices 40 of the plurality of devices 40 may be adjusted such that the delayed reference clock signals are aligned (in phase) with each other in the plurality of the devices 40. An output of variable delay circuit 41 is coupled to a charge pump phase-locked loop (PLL) 43, in this example an integer charge pump PLL, which generates a signal PHASE REF indicated by 41 having a desired frequency. This PHASE REF signal is amplified by amplifiers 45, 46.

When the reference clock signal is aligned by adjusting variable delay circuits 41, also the resulting PHASE REF signals may be aligned over a plurality of devices 40.

For receive path testing, one of the receive paths is activated while the others are deactivated, and the PHASE REF signals output by amplifier 45 or 46 is coupled to the respective amplifier 49 of the receive path to be tested via a respective coupler 411. The PHASE REF signal is then processed by the amplifier 49 and phase shifter 47 of the receive path to be tested and fed to a quadrature phase detector 413 via a coupler 414. Phase detector 413 compares the received signal with a local oscillator signal LO to determine a phase of the respective receive path. The LO and PHASE REF signals in the embodiment of FIG. 4 are derived from a same clock for example by means of integer N phased locked loops (PLL) 43, 418 and are synchronized in frequency. In this way, one after the other, the phases of all receive paths of devices 40 relative to the local oscillator signal LO may be measured, and therefore relative phase differences between the receive paths may be calibrated. Phase detector 413 may be a quadrature phase detector (QPD). By using quadrature phase detectors, also relative amplitude measurements between the paths may be performed, such that both amplitude and phase may be calibrated.

For testing of the transmit signal, based on reference clock REFCLK and a charge pump PLL 418, in this example an integer N charge pump PLL, a local oscillator signal as indicated by 417 is generated, set to a desired frequency and provided to the amplifier 415 through a finite isolation of up-converter/down-converter 416. From amplifier 415 and power combiner 410 the signal is then provided to the path under calibration comprised of phase shifter 48 and amplifier 47. An output for testing, then one of the transmit paths is activated, while the other transmit paths are disabled (for example amplification of the respective amplifiers 48 of the disabled transmit path set to zero). The output of the amplifier 48 of the activated transmit path is then coupled to an input of a phase detector 412, e.g. a quadrature phase detector, via a respective coupler 411 and compared to the PHASE REF signal output by amplifier 44 or 46, respectively. In this way, successively phases of the transmit path may be measured, providing a calibration.

It should be noted that no absolute phase measurements need to be made, but merely the relative phases across the transmit paths need to be calibrated.

For this calibration, aligned PHASE REF signals may be used across a plurality of devices 40. It should be noted that in the scheme discussed above, the PHASE REF signal through adjusting the variable delay 41 may be aligned across a plurality of devices, while the local oscillator signal 417 may have different phases on different chips.

In further embodiments, for calibration across a plurality of devices 40, one of the devices may be used as an upconverter/downconverter, while the remaining devices are calibrated.

Figure 5:
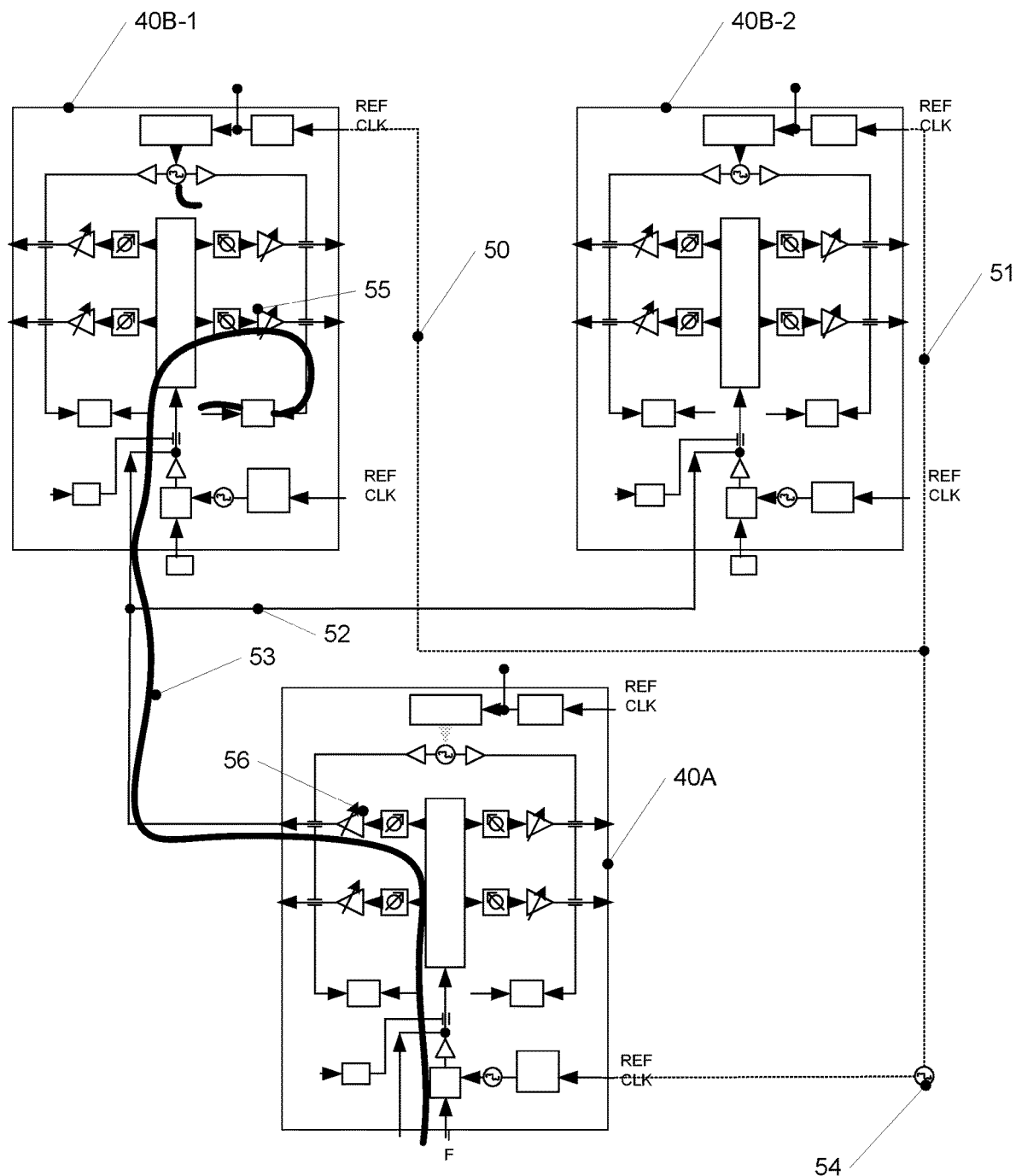
FIG. 5 is a diagram illustrating transmit calibration in a system according to an embodiment.

Such a transmit path calibration will now be discussed referring to FIG. 5. FIG. 5 illustrates a system according to an embodiment using a plurality of devices 40 as illustrated in FIG. 4. One of the devices 40, labelled 40A in FIG. 5, serves as an upconverter for providing a reference signal for transmit path testing. Other devices 40, of which two devices 40, 40B-1 and 40B-2 are shown in FIG. 5, are tested.

For clarity's sake, not all elements of the devices 40 are shown in FIG. 5, and some labelling has been omitted. Therefore, when describing FIG. 5, reference will also be made to FIG. 4 for details of the respective devices 40A, 40B-1 and 40B-2, which each may be implemented as shown for device 40 of FIG. 4.

In FIG. 5, a clock signal generator 54, which may be implemented using a conventional oscillator circuit, e.g. including a phase-locked loop and a reference oscillator like a Quartz oscillator generates a reference clock signal. The reference clock is provided to the Integer N charge pump PLL 418 of device 40A to provide a local oscillator signal 407 to be provided to upconverter/downconverter 416 for upconversion. Furthermore, the reference clock is provided to variable delays 41 of devices 40B-1 and 40B-2. Different path lengths 50, 51 from clock generator 54 to devices 40B-1, 40B-2 may cause phase differences, which are compensated for by the variable delay circuits 41 as explained previously.

In the situation shown in FIG. 5, a transmit path 55 of device 40B-1 is tested, while the remaining transmit paths of devices 40B-1, 40B-2 are deactivated. In the same manner, successively also the other transmit paths of devices 40B-1, 40B-2. In FIG. 5, a bold line 53 generally illustrates a signal path for testing transmit path 55. An intermediate frequency signal is provided to up-converter/downconverter 416 of device 40A and is up-converted based on the local oscillator signal 417. Via a transmit path 56 of device 40A, and via a connection 52, this signal is provided to devices 40B-1, 40B-2 at RF bypass inputs (see FIG. 4) bypassing the upconverter 416 and amplifier 415 of devices 40B-1, 40B-2. Via power combiner 410 of device 40B-1, the signal is then provided to transmit path 55 to be tested. An output signal of transmit path 55 is then provided to phase detector 412 via a respective coupler 411 and compared with the PHASE REF signal 45 of device 40B-1. As already mentioned, as the variable delay 41 of devices 40B-1, 40B-2 are aligned for example to take different line length 50, 51 into account, also the signal PHASE REF in devices 40B-1, 40B-2 are aligned, thus allowing a calibration across the devices. Every integer charge pump PLL 403 is a type II PLL, which forces the average phase of all PHASE REF signals 54 in all devices 40 to be equal provided that the phase of the ref clk signals are made equal using variable delays 41 in devices 40.

Figure 6:
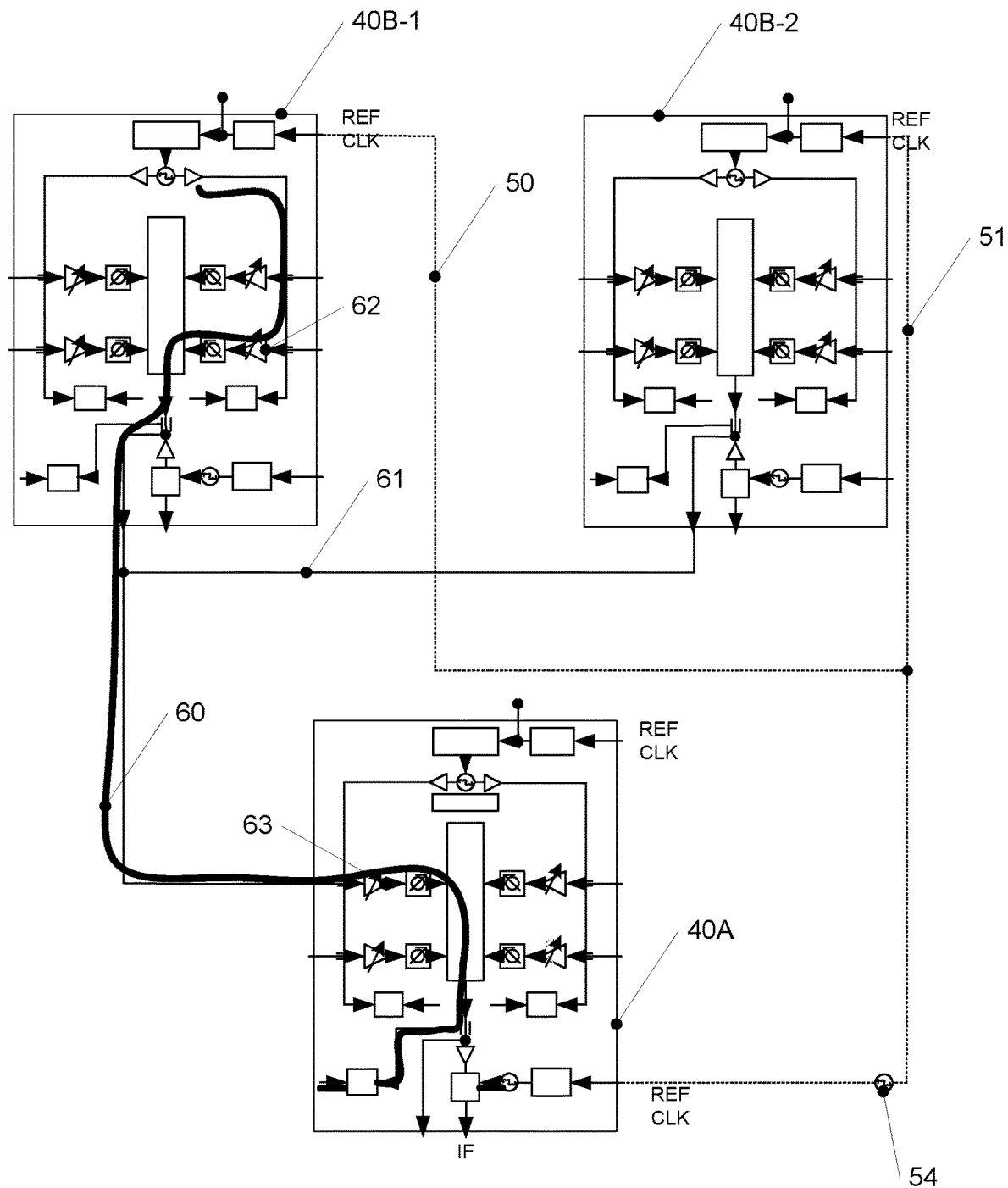
FIG. 6 is a diagram illustrating receive calibration in a system according to an embodiment.

Next, receive path testing will be discussed referring to FIG. 6. FIG. 6 illustrates the same system as discussed for FIG. 5, and like elements bear the same reference numerals and will not be discussed again.

In FIG. 6, a receive path 62 of device 40B-1 is to be tested, and the remaining receive paths of devices 40B-1, 40B-2 are deactivated. In this manner, all receive paths may be tested successively.

In this case, device 40A performs the relative quadrature phase measurement.

A bold line 60 indicates the signal path for testing of receive path 62. In particular, the aligned reference signal generated using variable delay 41 of device 40B-1 as explained previously and output by amplifier 44 is provided to receive path 62 via the respective coupler 411. Via power combiner 410 of device 40B-1 and the RF bypass path of device 40B-1, the signal is provided to a receive path of device 40A via lines 61 (which may be the same or separate lines from lines 52 of FIG. 5 via this receive path 63 and power combiner 410 of device 40A, the signal is provided to quadrature phase detector 413, where relative phase and amplitude are detected, using local oscillator signal 417 of device 40A as a reference. Therefore, in this case device 40A acts as a sink for the signals, and the remaining devices 40B-1, 40B-2 are configured in receive mode. Again, using the variable delays in a previous calibration, for example at a factory, as explained above, the PHASE REF signal 54 is aligned in all devices 40B-1, 40B-2, the variable delays compensating for example the length differences of lines 50, 51.

Figure 7:
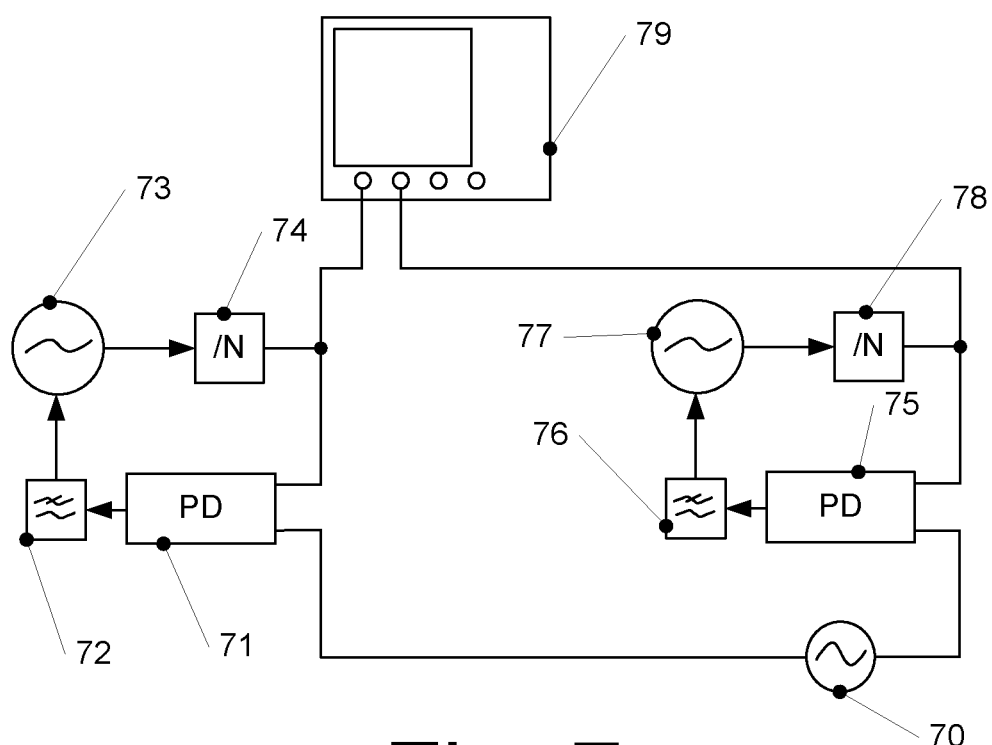
FIG. 7 illustrates phase differences in different PLL which may be compensated using some embodiments.

The calibration of the variable delays 12 of device to of FIG. 1 or 41 of device 40 of FIG. 4 will now be explained in some more detail referring to FIG. 7. FIG. 7 may be seen as a setup of a proof-of-concept experiment of some embodiments.

FIG. 7 illustrates two phase-locked loops, in this example integer N phase locked loops, which may correspond to phase-locked loops 43 of device 40. A first phase-locked loop comprises a phase detector 71, a low path filter (loop filter) 72, a controllable oscillator 73 (for example voltage-controlled oscillator, VCO) and a frequency divider 74, as common in phase-locked loops. A second phase-locked loop comprises a phase detector 57, a low pass filter (loop filter) 76, a controllable oscillator 77 (for example a VCO) and a frequency divider 78. An oscillator 70 generates a reference signal, corresponding to the REF CLK signal of FIG. 4 or the signal clk of FIG. 1.

Due to different lengths of lines from oscillator 70 to phase detectors 71, 75, the phases of the reference signal generated by oscillator 700 will differ at phase detectors 71 and 75. This results in a misalignment of the signals generated by oscillators 73, 77 in a locked state of the phase-locked loops, and corresponding phase differences in the divided signals output by divider 74, 78, respectively. These phase differences are visible for example in an oscilloscope 79 shown in FIG. 7. By adjusting a delay circuit in the lines from oscillator 70 to phase detector 71 and/or phase detector 75, for example variable delay circuit 41 of FIG. 4 or variable delay 12 of FIG. 1, the phase differences due to different line length or other effects may be compensated, such that the output signals of oscillators 73, 77 and therefore the output signals of divider 74, 78 are in phase with each other, which may be seen as at least approximately identical curves on oscilloscope 79. Therefore, by using variable delay circuits phase-locked loops in different devices may be aligned. Operation of the device of FIG. 70 showed that the relative phase between two integer N phase locked loop outputs is stable and can be set to 0 by applying delay/phase shift to clock signals supplied to the phase locked loops.

Figure 8:
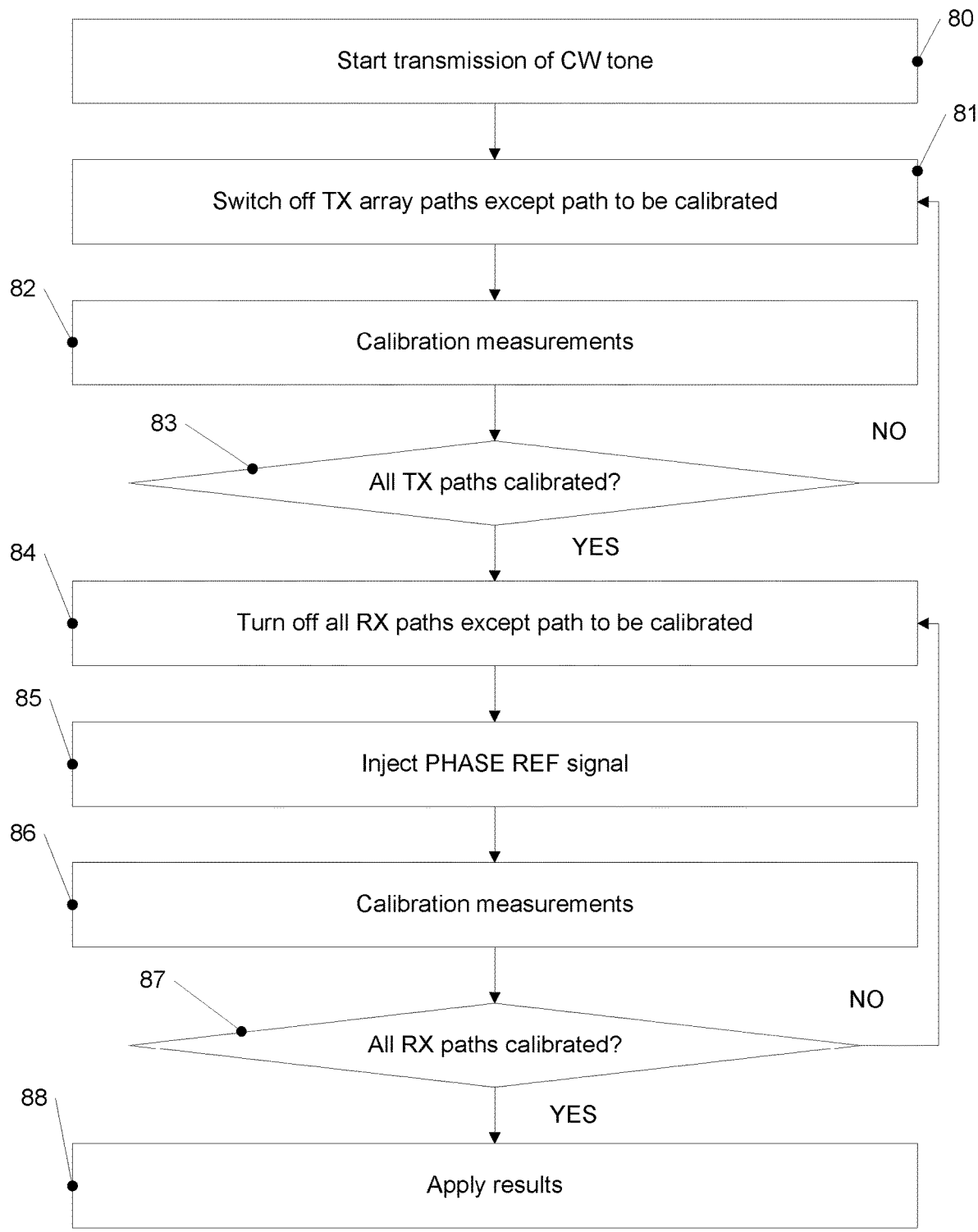
FIG. 8 is a flow chart illustrating a method according to an embodiment.

FIG. 8 is a flow chart illustrating a method according to an embodiment. To avoid repetitions and to provide a clearer understanding, the method of FIG. 8 will be discussed referring to FIGS. 4 to 6 described above. However, it is to be understood that the method of FIG. 8 may also be implemented in other systems as the one explicitly described. Moreover, in the method of FIG. 8, both transmit and receive paths are calibrated. In other embodiments, only transmit paths or only receive paths may be calibrated. Moreover, while the method of FIG. 8 is described and depicted as a series of acts or events, the order in which these acts or events are described is not to be construed as limiting. For example, while in FIG. 8 first the transmit paths and then the receive paths are calibrated, in other embodiments this order may be reversed.

Prior to performing the calibration, for example at a factory variable delay circuits like 41 of FIG. 4 are adjusted such that all devices (for example devices 40, which may be separate integrated chips) may use aligned PHASE REF signals.

For the calibration procedure of the transmit paths (see for example FIG. 5) regular signal transmission is stopped, and as signal used for testing a continuous wave tone is provided. In case of FIG. 5, this continuous wave tone serves as signal IF provided to device 40A. Furthermore, in devices to be calibrated, all transmit paths are switched off except the path to be calibrated (in the example of FIG. 5, transmit path 55). Then, at 82 calibration measurements, for example using quadrature phase detectors like quadrature phase detectors 412 of FIG. 4, are performed as illustrated and explained with reference to FIG. 5, for example.

As indicated at 83, this is repeated until all transmit paths are calibrated. When all transmit paths are calibrated, transmission calibration is finished. The measurements results at 82 may for example be stored in a memory, for example in form of a calibration table, after each measurement.

At 84, calibration of receive paths starts. At 84, all receive paths expect the receive path to be calibrated (path 62 in the example of FIG. 6). At 85, the PHASE REF signal of the respective device of the receive path to be tested is injected into the receive path, as illustrated for example in FIG. 6. At 86, corresponding calibration measurements are performed and stored for the respective receive path, for example performed by quadrature phase detector 413 of device 40A of FIG. 6. As indicated by 87, the actions described with reference to 84 to 86 are repeated until all paths are calibrated. At 88, the calibration results are applied in actual beam forming. For example phases or amplitudes to be set for a particular beam forming application may be corrected based on the calibration results.

In some embodiments, the calibration illustrated may for example be performed at start-up of a device, or otherwise in periods where the device is inactive. In other embodiments, calibration may also be performed during operation of the device. An example of how such a calibration during operation of a phased array system may be performed. An example for such a calibration during operation will now be explained with reference to FIG. 9. For further explanations, reference will also be made to previously discussed figures.

Figure 9:
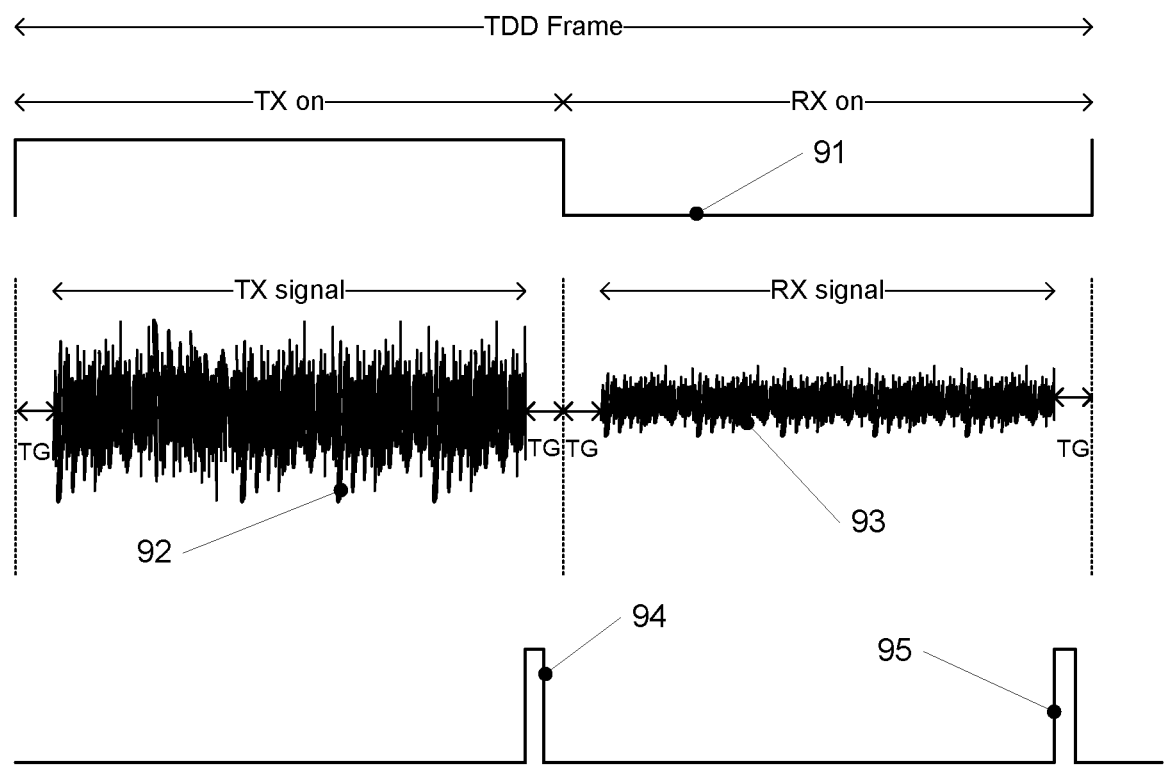
FIG. 9 is a diagram illustrating calibration during operation according to some embodiments.

FIG. 9 illustrates operation in a time division duplexing (TDD) mode, where transmission is performed in time division duplexing (TDD) frames, of which one TDD frame 900 is illustrated in FIG. 9. During each TDD frame, a part of the time is reserved for transmission (TX on in FIG. 9), and another part is reserved for reception (RX on in FIG. 9), as also illustrated by a curve 91. During the TX on time, a transmit signal 92 is transmitted, and during the receive on time, a receive signal 93 is received in the example of FIG. 9. Between the transmit signal 92 and the receive signal 93, time gaps TG are employed for clear separation of the signal. During these time gaps, transmission calibration and reception calibration is performed in some embodiments. For example, in some embodiments during a time gap TG following transmission signal 92, as indicated by 94 transmission calibration may be performed, and in a time gap following receive signal 93, receive calibration may be performed. Referring back to FIG. 8, for example in an embodiment 80 follows the transmit signal 92 (at 94 in FIG. 9), and 84 follows the receive signal 93 (i.e. at 95 in FIG. 9).

It should be noted that depending on the length of the time gap, the time may be not sufficient to calibrate all transmit paths or all receive paths within a single time gap (i.e. at 94 or 95). In such a case, during each TDD frame, only a part of the transmit paths or receive paths may be calibrated in some embodiments. For example, during a first TDD frame, the first L, L being an integer number, paths may be calibrated, during a next TDD frame, the next L paths, etc., until all paths are calibrated. This calibration may be repeated periodically. In this way, for example temperature variations of the phase differences which may occur during operation may be compensated.

It should be noted that the concept of FIG. 9 using time gaps between transmit and receive signals for calibration may not only be used for the calibration as outlined before referring to FIGS. 1 to 8, but may also be used in connection with other types of calibration, for example conventional calibration techniques for phased array systems.

In view of the variations and modifications discussed above, it should be emphasized again that the discussed embodiments serve as examples only and are not to be construed as limiting.

According to some embodiments, the following examples are provided:

Example 1

A radio frequency, RF, device, comprising: a clock input terminal (15), a variable delay circuit (12; 41), wherein an input of the variable delay circuit (12; 41) is coupled to the clock input terminal (15), a test terminal (14), wherein the test terminal is coupled to an output of the delay circuit (12; 41), a reference signal generator (13; 43) coupled to the output of the delay circuit and configured to generate a reference signal based on a clock signal received at the clock input terminal delayed by the variable delay circuit, and an RF circuit (11) configured to receive the reference signal.

Example 2

The device of Example 1, wherein the RF circuit (11) comprises built-in calibration circuitry (411, 412, 413, 414) configured to perform a calibration of the RF circuit based on the reference signal.

Example 3

The device of Example 2, wherein the RF circuit comprises a plurality of at least one of transmit paths or receive paths, each transmit path or receive path comprising a phase shifter, wherein the calibration circuitry is configured to calibrate phase shifts of the phase shifters.

Example 4

The device of Example 3, wherein each of the at least one of transmit paths or receive paths comprises an adjustable amplifier, wherein the calibration circuitry is configured to calibrate amplitudes of the adjustable amplifiers.

Example 5

The device of Example 2, wherein the calibration circuitry is configured to perform calibration in time gaps of a time division duplexing transmission.

Example 6

The device of Example, wherein the reference signal generator (13; 43) comprises a phase-locked loop circuit, the delayed clock signal serving as reference clock for the phase-locked circuit.

Example 7

The device of Example 1, wherein the RF circuit is a phased array control circuit configured to be coupled to an antenna array.

Example 8

The device of Example 1, wherein the device is integrated in a single chip.

Example 9

A system, comprising: a plurality of devices of any one of Examples 1 to 8, and a clock generator (54), wherein the clock generator is coupled with clock input terminals (15) of at least a subset of the plurality of devices, wherein the variable delay circuits (12; 41) of the subset of the plurality of devices are set to compensate delay variations due to different coupling lengths between the clock generator and the subset of devices.

Example 10

The system of Example 9, wherein each device of the plurality of devices comprises at least one transmit path, wherein, for transmit path calibration, the system is configured to set a first device of the plurality of devices as a signal source which consecutively transmits a test signal to the transmit paths of the device of the plurality of devices other than the first device.

Example 11

The system of Example to, wherein the first device comprises an intermediate frequency input and an upconverter and is configured to upconvert an intermediate frequency signal at the intermediate frequency input and transmit it as the test signal via one of its receive paths.

Example 12

The system of Example to, wherein the other devices of the plurality of devices are configured to receive the test signal and to provide the test signal to a transmit path to be tested, and to compare an output signal of the transmit path to be tested with a device derived from the reference signal of the respective chip.

Example 13

The system of Example 9, wherein each device of the plurality of devices comprises at least one receive path, wherein, for receive path calibration, the system is configured to set a first device of the plurality of devices as a signal sink which consecutively receives a calibration signal from the receive paths of the device of the plurality of devices other than the first device.

Example 14

The system of Example 13, wherein the first device comprises a phase detector configured to compare the calibration signal to a reference signal.

Example 15

The system of Example 13, wherein the other devices of the plurality of devices are configured to generate a test signal based on an output of their respective variable delay circuits and to provide the test signal to a receive path to be tested, and to provide the calibration signal based on an output of the receive path to be tested.

Example 16

A method, comprising: switching off transmit paths and/or receive paths except a transmit path and/or receive path to be calibrated, performing a calibration measurements based on a reference signal which is provided via a variable delay, and repeating the calibration for a plurality of transmit and/or receive paths to be calibrated.

Example 17

The method of example 16, further comprising performing the measurement in time gaps of a time division duplexing transmission.

Example 18

The method of Example 16, wherein the method is performed using the device of any one of examples 1 to 9 or a system of any one of Examples 10 to 15.

Example 19

A method, comprising: operating a phased antenna array in a time division duplexing scheme, and calibrating at least one of transmit paths or receive paths in time gaps between transmit signals and receive signals of the time division duplexing scheme.

Example 20

The method of Example 19, further comprising successively calibrating transmit paths or receive paths in successive frames of the time division duplexing transmission.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency, RF, device, comprising:
   a clock input terminal;
   a single variable delay circuit on the device, wherein an input of the single variable delay circuit is coupled to the clock input terminal;
   a test terminal, wherein the test terminal is coupled to an output of the delay circuit;
   a reference signal generator coupled to the output of the delay circuit and configured to generate a reference signal based on a clock signal received at the clock input terminal delayed by the variable delay circuit; and
   an RF circuit configured to receive the reference signal, wherein the reference signal generator comprises a phase-locked loop circuit, the delayed clock signal serving as reference clock for the phase-locked loop circuit,
   wherein the RF circuit comprises built-in calibration circuitry configured to perform a calibration of the RF circuit based on the reference signal, wherein the RF circuit comprises a plurality of transmit paths or receive paths, each transmit path or receive path comprising a phase shifter, wherein the calibration circuitry is configured to calibrate phase shifts of the phase shifters, and wherein the single variable delay circuit is separate from the phase shifters.

2. The device of claim 1, wherein each of the transmit paths or receive paths comprises an adjustable amplifier, wherein the calibration circuitry is configured to calibrate amplitudes of the adjustable amplifiers.

3. The device of claim 1, wherein the calibration circuitry is configured to perform calibration in time gaps of a time division duplexing transmission.

4. The device of claim 1, wherein the RF circuit is a phased array control circuit configured to be coupled to an antenna array.

5. The device of claim 1, wherein the device is integrated in a single chip.

6. A system, comprising:
   a plurality of devices, each device comprising
      a clock input terminal, a single variable delay circuit on each device, wherein an input of the variable delay circuit is coupled to the clock input terminal, a test terminal, wherein the test terminal is coupled to an output of the delay circuit, a reference signal generator coupled to the output of the delay circuit and configured to generate a reference signal based on a clock signal received at the clock input terminal delayed by the variable delay circuit, and an RF circuit configured to receive the reference signal, the RF circuit comprising a plurality of adjustable phase shifters separate from the single variable delay circuit; and a clock generator, wherein the clock generator is coupled with clock input terminals of at least a subset of the plurality of devices, wherein the variable delay circuits of the subset of the plurality of devices are configured to compensate delay variations due to different coupling lengths between the clock generator and the subset of the plurality of devices.

7. The system of claim 6, wherein each device of the plurality of devices comprises at least one transmit path, wherein, for transmit path calibration, the system is configured to set a first device of the plurality of devices as a signal source which consecutively transmits a test signal to the transmit paths of the device of the plurality of devices other than the first device.

8. The system of claim 7, wherein the first device comprises an intermediate frequency input and an upconverter and is configured to upconvert an intermediate frequency signal at the intermediate frequency input and transmit it as the test signal via one of its receive paths.

9. The system of claim 7, wherein the other devices of the plurality of devices are configured to receive the test signal and to provide the test signal to a transmit path to be tested, and to compare an output signal of the transmit path to be tested with a device derived from the reference signal of the respective device of the plurality of devices.

10. The system of claim 6, wherein each device of the plurality of devices comprises at least one receive path, wherein, for receive path calibration, the system is configured to set a first device of the plurality of devices as a signal sink which consecutively receives a calibration signal from the receive paths of the device of the plurality of devices other than the first device.

11. The system of claim 10, wherein the first device comprises a phase detector configured to compare the calibration signal to a reference signal.

12. The system of claim 10, wherein the other devices of the plurality of devices are configured to generate a test signal based on an output of their respective variable delay circuits and to provide the test signal to a receive path to be tested, and to provide the calibration signal based on an output of the receive path to be tested.

13. The system of claim 6, wherein the plurality of devices are integrated in a corresponding plurality of chips.

14. A method, comprising:
switching off transmit paths and/or receive paths except a transmit path and/or receive path to be calibrated;
performing a calibration measurements based on a reference signal which is provided via a variable delay; and
repeating the calibration for a plurality of transmit and/or receive paths to be calibrated,
wherein the method is performed using a device comprising:
a clock input terminal,
a single variable delay circuit on the device, wherein an input of the single variable delay circuit is coupled to the clock input terminal,
a test terminal, wherein the test terminal is coupled to an output of the delay circuit,
a reference signal generator coupled to the output of the delay circuit and configured to generate a reference signal based on a clock signal received at the clock input terminal delayed by the variable delay circuit,
an RF circuit configured to receive the reference signal, and
a plurality of phase shifters associated with the plurality of transmit and/or receive paths separate from the single variable delay circuit.

15. The method of claim 14, further comprising performing the calibration measurement in time gaps of a time division duplexing transmission.

16. The device of claim 14, wherein the device is integrated in a single chip.

* * * * *